United States Patent
Sakurai et al.

(10) Patent No.: US 9,551,062 B2
(45) Date of Patent: Jan. 24, 2017

(54) HARD FILM FOR MACHINING TOOLS AND HARD FILM-COATED METAL MACHINING TOOL

(71) Applicants: Masatoshi Sakurai, Toyokawa (JP); Mei Wang, Toyokawa (JP); Toshihiro Ohchi, Toyokawa (JP); Yuji Sutou, Sendai (JP); Junichi Koike, Sendai (JP); Shoko Komiyama, Sendai (JP)

(72) Inventors: Masatoshi Sakurai, Toyokawa (JP); Mei Wang, Toyokawa (JP); Toshihiro Ohchi, Toyokawa (JP); Yuji Sutou, Sendai (JP); Junichi Koike, Sendai (JP); Shoko Komiyama, Sendai (JP)

(73) Assignees: OSG CORPORATION, Toyokawa-shi (JP); NATIONAL UNIVERSITY CORPORATION TOHOKU UNIVERSITY, Sendai-shi (JP)

(*) Notice: Subject to any disclaimer, the term of this patent is extended or adjusted under 35 U.S.C. 154(b) by 0 days.

(21) Appl. No.: 14/775,419

(22) PCT Filed: Mar. 28, 2013

(86) PCT No.: PCT/JP2013/059400
§ 371 (c)(1),
(2) Date: Sep. 11, 2015

(87) PCT Pub. No.: WO2014/155633
PCT Pub. Date: Oct. 2, 2014

(65) Prior Publication Data
US 2016/0017478 A1 Jan. 21, 2016

(51) Int. Cl.
C23C 14/06 (2006.01)

(52) U.S. Cl.
CPC ............ *C23C 14/0676* (2013.01); *C23C 14/06* (2013.01); *C23C 14/0635* (2013.01); *C23C 14/0641* (2013.01)

(58) Field of Classification Search
USPC .. 51/307, 309; 106/286.1, 0.4, 0.8; 428/325, 336, 697, 698, 699
See application file for complete search history.

(56) References Cited

U.S. PATENT DOCUMENTS

| | | | |
|---|---|---|---|
| 6,372,369 B1 | 4/2002 | Ito et al. | |
| 2005/0019613 A1* | 1/2005 | Misaki | C23C 14/024 428/698 |

(Continued)

FOREIGN PATENT DOCUMENTS

| | | |
|---|---|---|
| CN | 101121309 A | 2/2008 |
| CN | 101432461 A | 5/2009 |

(Continued)

OTHER PUBLICATIONS

May 14, 2013 Search Report issued in International Patent Application No. PCT/JP2013/059400.

(Continued)

*Primary Examiner* — Archene Turner
(74) *Attorney, Agent, or Firm* — Oliff PLC (57) ABSTRACT

A tool hard film that is to be disposed as coating on a surface of a tool, the tool hard film being a TiCrMoWV oxycarbide, oxynitride, or oxycarbonitride having a phase with a NaCl-type crystal structure as a main phase, the oxycarbide, oxynitride, or oxycarbonitride having fine crystals due to introduction of oxygen.

7 Claims, 6 Drawing Sheets

(56) References Cited

U.S. PATENT DOCUMENTS

| | | | |
|---|---|---|---|
| 2006/0032602 A1* | 2/2006 | Inoue | B22D 17/2209 164/312 |
| 2006/0269789 A1 | 11/2006 | Toihara et al. | |
| 2008/0038503 A1 | 2/2008 | Yamamoto | |
| 2008/0171183 A1* | 7/2008 | Yamamoto | B32B 15/013 428/215 |
| 2009/0101070 A1 | 4/2009 | Ohmi et al. | |
| 2009/0317659 A1* | 12/2009 | Yamamoto | C23C 14/022 428/655 |
| 2010/0047545 A1* | 2/2010 | Yamamoto | C23C 14/06 428/220 |

FOREIGN PATENT DOCUMENTS

| | | | |
|---|---|---|---|
| JP | H06-346076 A | | 12/1994 |
| JP | H07-145483 A | | 6/1995 |
| JP | 2001-090835 A | | 4/2001 |
| JP | 3373590 B2 | | 2/2003 |
| JP | 2003-165003 A | | 6/2003 |
| JP | 2004-115826 A | | 4/2004 |
| JP | 2006-124818 | * | 5/2006 |
| JP | 2006-336032 A | | 12/2006 |
| JP | 2008-063654 A | | 3/2008 |
| JP | 2008-296337 A | | 12/2008 |
| JP | 2011-058045 A | | 3/2011 |
| JP | 2011-089199 A | | 5/2011 |
| JP | 2012-036506 A | | 2/2012 |
| JP | 2012-115923 A | | 6/2012 |
| WO | 2010/150411 A1 | | 12/2010 |
| WO | 2012/069475 A1 | | 5/2012 |

OTHER PUBLICATIONS

Sep. 6, 2016 Office Action issued in Japanese Patent Application no. 2015-507823.

Sep. 28, 2016 Office Action issued in Korean Patent Application No. 2015-7027265.

Nov. 3, 2016 extended European Search Report issued in Application No. 13880426.5.

* cited by examiner

| TEST PRODUCT | FILM STRUCTURE | FILM THICKNESS (μm) | GRAIN DIAMETER (nm) | MACHINED HOLE NUMBER | JUDGMENT |
|---|---|---|---|---|---|
| INVENTIVE PRODUCT 1 | (Ti0.7Cr0.01Mo0.19W0.05V0.05)0.49C0.44O0.07 | 5.7 | 90 OR LESS | 2760 | ACCEPTED |
| INVENTIVE PRODUCT 2 | (Ti0.65Cr0.05Mo0.2W0.05V0.05)0.49C0.44O0.07 | 5.8 | 90 OR LESS | 2660 | ACCEPTED |
| INVENTIVE PRODUCT 3 | (Ti0.6Cr0.05Mo0.25W0.05V0.05)0.49C0.44O0.07 | 5.2 | 90 OR LESS | 2500 | ACCEPTED |
| INVENTIVE PRODUCT 4 | (Ti0.55Cr0.1Mo0.25W0.05V0.05)0.49C0.44O0.07 | 5.1 | 90 OR LESS | 2700 | ACCEPTED |
| INVENTIVE PRODUCT 5 | (Ti0.5Cr0.1Mo0.3W0.05V0.05)0.65C0.25O0.1 | 4.7 | 90 OR LESS | 2470 | ACCEPTED |
| INVENTIVE PRODUCT 6 | (Ti0.5Cr0.1Mo0.35W0.02V0.03)0.65C0.3O0.05 | 4.7 | 90 OR LESS | 2109 | ACCEPTED |
| INVENTIVE PRODUCT 7 | (Ti0.45Cr0.1Mo0.4W0.02V0.03)0.65C0.3O0.05 | 4.4 | 90 OR LESS | 2200 | ACCEPTED |
| INVENTIVE PRODUCT 8 | (Ti0.47Cr0.01Mo0.5W0.01V0.01)0.5C0.35O0.15 | 4.3 | 90 OR LESS | 2176 | ACCEPTED |
| INVENTIVE PRODUCT 9 | (Ti0.45Cr0.03Mo0.5W0.01V0.01)0.48C0.4O0.12 | 4.2 | 60 OR LESS | 3100 | ACCEPTED |
| INVENTIVE PRODUCT 10 | (Ti0.4Cr0.08Mo0.5W0.01V0.01)0.48C0.4O0.12 | 4.5 | 40 OR LESS | 3230 | ACCEPTED |
| INVENTIVE PRODUCT 11 | (Ti0.45Cr0.05Mo0.45W0.02V0.03)0.48C0.4O0.12 | 4.5 | 40 OR LESS | 3310 | ACCEPTED |
| INVENTIVE PRODUCT 12 | (Ti0.45Cr0.01Mo0.45W0.05V0.04)0.5C0.45O0.05 | 4.6 | 60 OR LESS | 3120 | ACCEPTED |
| INVENTIVE PRODUCT 13 | (Ti0.4Cr0.06Mo0.45W0.04V0.05)0.5C0.45O0.05 | 5.2 | 40 OR LESS | 3240 | ACCEPTED |
| INVENTIVE PRODUCT 14 | (Ti0.35Cr0.15Mo0.45W0.02V0.03)0.5C0.45O0.05 | 5.4 | 90 OR LESS | 3390 | ACCEPTED |
| INVENTIVE PRODUCT 15 | (Ti0.3Cr0.2Mo0.45W0.02V0.03)0.44C0.5O0.06 | 4.7 | 40 OR LESS | 3200 | ACCEPTED |
| INVENTIVE PRODUCT 16 | (Ti0.25Cr0.25Mo0.45W0.01V0.04)0.44C0.5O0.06 | 4.9 | 60 OR LESS | 3005 | ACCEPTED |
| INVENTIVE PRODUCT 17 | (Ti0.2Cr0.35Mo0.35W0.05V0.05)0.41C0.53O0.06 | 5.0 | 60 OR LESS | 3100 | ACCEPTED |
| INVENTIVE PRODUCT 18 | (Ti0.2Cr0.4Mo0.35W0.01V0.04)0.46C0.49O0.05 | 5.5 | 40 OR LESS | 3204 | ACCEPTED |
| INVENTIVE PRODUCT 19 | (Ti0.35Cr0.26Mo0.35W0.02V0.02)0.46C0.49O0.05 | 5.1 | 60 OR LESS | 3100 | ACCEPTED |
| INVENTIVE PRODUCT 20 | (Ti0.45Cr0.07Mo0.45W0.01V0.02)0.46C0.49O0.05 | 7.1 | 40 OR LESS | 3301 | ACCEPTED |
| INVENTIVE PRODUCT 21 | (Ti0.55Cr0.1Mo0.25W0.05V0.05)0.47C0.48O0.05 | 4.9 | 40 OR LESS | 3206 | ACCEPTED |
| INVENTIVE PRODUCT 22 | (Ti0.5Cr0.1Mo0.3W0.05V0.05)0.47C0.49O0.04 | 4.9 | 60 OR LESS | 3007 | ACCEPTED |
| INVENTIVE PRODUCT 23 | (Ti0.5Cr0.1Mo0.35W0.02V0.03)0.47C0.49O0.04 | 7.2 | 60 OR LESS | 3080 | ACCEPTED |
| INVENTIVE PRODUCT 24 | (Ti0.4Cr0.1Mo0.45W0.02V0.03)0.47C0.49O0.04 | 6.7 | 40 OR LESS | 3310 | ACCEPTED |
| INVENTIVE PRODUCT 25 | (Ti0.47Cr0.01Mo0.5W0.01V0.01)0.51C0.47O0.02 | 5.9 | 60 OR LESS | 2900 | ACCEPTED |
| INVENTIVE PRODUCT 26 | (Ti0.45Cr0.03Mo0.5W0.01V0.01)0.51C0.47O0.02 | 5.3 | 60 OR LESS | 3010 | ACCEPTED |
| INVENTIVE PRODUCT 27 | (Ti0.4Cr0.08Mo0.5W0.01V0.01)0.51C0.47O0.02 | 5.4 | 60 OR LESS | 3140 | ACCEPTED |
| INVENTIVE PRODUCT 28 | (Ti0.4Cr0.05Mo0.45W0.05V0.05)0.51C0.47O0.02 | 9.0 | 40 OR LESS | 3200 | ACCEPTED |
| INVENTIVE PRODUCT 29 | (Ti0.45Cr0.01Mo0.45W0.05V0.04)0.5C0.48O0.02 | 8.4 | 40 OR LESS | 3210 | ACCEPTED |
| INVENTIVE PRODUCT 30 | (Ti0.4Cr0.06Mo0.45W0.04V0.05)0.5C0.48O0.02 | 8.2 | 60 OR LESS | 3010 | ACCEPTED |
| INVENTIVE PRODUCT 31 | (Ti0.35Cr0.15Mo0.45W0.02V0.03)0.5C0.49O0.01 | 7.8 | 40 OR LESS | 3410 | ACCEPTED |
| INVENTIVE PRODUCT 32 | (Ti0.3Cr0.2Mo0.45W0.02V0.03)0.5C0.49O0.01 | 6.2 | 40 OR LESS | 3369 | ACCEPTED |
| INVENTIVE PRODUCT 33 | (Ti0.25Cr0.25Mo0.45W0.01V0.04)0.5C0.49O0.01 | 8.0 | 40 OR LESS | 3266 | ACCEPTED |
| INVENTIVE PRODUCT 34 | (Ti0.2Cr0.35Mo0.35W0.05V0.05)0.5C0.49O0.01 | 5.9 | 40 OR LESS | 3219 | ACCEPTED |
| INVENTIVE PRODUCT 35 | (Ti0.2Cr0.4Mo0.35W0.01V0.04)0.52C0.44O0.04 | 5.8 | 60 OR LESS | 3100 | ACCEPTED |
| INVENTIVE PRODUCT 36 | (Ti0.35Cr0.26Mo0.35W0.02V0.02)0.52C0.44O0.04 | 5.1 | 60 OR LESS | 3104 | ACCEPTED |
| INVENTIVE PRODUCT 37 | (Ti0.45Cr0.07Mo0.45W0.02V0.01)0.52C0.44O0.04 | 8.0 | 60 OR LESS | 3160 | ACCEPTED |
| INVENTIVE PRODUCT 38 | (Ti0.65Cr0.2Mo0.1W0.02V0.03)0.52C0.44O0.04 | 10.0 | 60 OR LESS | 3010 | ACCEPTED |
| INVENTIVE PRODUCT 39 | (Ti0.6Cr0.3Mo0.05W0.02V0.03)0.42C0.53O0.05 | 5.0 | 40 OR LESS | 3310 | ACCEPTED |
| INVENTIVE PRODUCT 40 | (Ti0.55Cr0.33Mo0.05W0.02V0.05)0.49C0.38O0.13 | 3.5 | 90 OR LESS | 2870 | ACCEPTED |
| INVENTIVE PRODUCT 41 | (Ti0.5Cr0.4Mo0.05W0.04V0.01)0.49C0.38O0.13 | 4.4 | 90 OR LESS | 2700 | ACCEPTED |
| INVENTIVE PRODUCT 42 | (Ti0.45Cr0.4Mo0.1W0.03V0.02)0.49C0.38O0.13 | 2.0 | 90 OR LESS | 2600 | ACCEPTED |
| INVENTIVE PRODUCT 43 | (Ti0.7Cr0.01Mo0.19W0.05V0.05)0.48C0.38O0.14 | 1.7 | 90 OR LESS | 2300 | ACCEPTED |
| INVENTIVE PRODUCT 44 | (Ti0.65Cr0.05Mo0.2W0.05V0.05)0.48C0.38O0.14 | 1.9 | 90 OR LESS | 2401 | ACCEPTED |
| INVENTIVE PRODUCT 45 | (Ti0.2Cr0.2Mo0.5W0.05V0.05)0.5C0.49O0.01 | 2.0 | 90 OR LESS | 2349 | ACCEPTED |
| CONVENTIONAL PRODUCT 1 | (Ti0.15Cr0.8Mo0.05)0.5C0.5 | 5.5 | 150 OR MORE | 1400 | REJECTED |
| CONVENTIONAL PRODUCT 2 | (Ti0.55Cr0.35Mo0.1)0.5C0.5 | 5.7 | 120 OR MORE | 1990 | REJECTED |
| CONVENTIONAL PRODUCT 3 | (Ti0.5Cr0.49Mo0.01)0.5C0.5 | 4.9 | 120 OR MORE | 1988 | REJECTED |
| CONVENTIONAL PRODUCT 4 | (Ti0.9Cr0.05Mo0.05)0.5C0.5 | 2.0 | 150 OR MORE | 1700 | REJECTED |
| CONVENTIONAL PRODUCT 5 | (Ti0.8Cr0.15Mo0.05)0.5C0.5 | 1.4 | 150 OR MORE | 1540 | REJECTED |
| CONVENTIONAL PRODUCT 6 | Ti0.5N0.5 | 1.1 | 200 OR MORE | 1570 | REJECTED |
| TEST PRODUCT 1 | (Ti0.15Cr0.4Mo0.35W0.05V0.05)0.5C0.15O0.35 | 9.0 | 130 OR MORE | 1600 | REJECTED |
| TEST PRODUCT 2 | (Ti0.2Cr0.4Mo0.35W0.01V0.04)0.55C0.1O0.35 | 10.0 | 130 OR MORE | 1680 | REJECTED |
| TEST PRODUCT 3 | (Ti0.35Cr0.26Mo0.35W0.02V0.02)0.4C0.25O0.35 | 2.2 | 130 OR MORE | 1800 | REJECTED |
| TEST PRODUCT 4 | (Ti0.45Cr0.08Mo0.45W0.01V0.01)0.5C0.15O0.35 | 3.4 | 130 OR MORE | 1741 | REJECTED |
| TEST PRODUCT 5 | (Ti0.65Cr0.2Mo0.1W0.02V0.03)0.5C0.05O0.45 | 3.2 | 150 OR MORE | 1460 | REJECTED |
| TEST PRODUCT 6 | (Ti0.6Cr0.3Mo0.05W0.02V0.03)0.5C0.05O0.45 | 4.5 | 150 OR MORE | 1580 | REJECTED |
| TEST PRODUCT 7 | (Ti0.55Cr0.33Mo0.05W0.02V0.05)0.51C0.09O0.4 | 5.9 | 130 OR MORE | 1470 | REJECTED |
| TEST PRODUCT 8 | (Ti0.5Cr0.4Mo0.05W0.04V0.01)0.5C0.15O0.35 | 4.1 | 130 OR MORE | 1748 | REJECTED |
| TEST PRODUCT 9 | (Ti0.75Cr0.05Mo0.15W0.03V0.02)0.5C0.1O0.4 | 6.8 | 130 OR MORE | 1047 | REJECTED |
| TEST PRODUCT 10 | (Ti0.8Cr0.05Mo0.05W0.05V0.05)0.5C0.1O0.4 | 0.5 | 130 OR MORE | 1060 | REJECTED |
| TEST PRODUCT 11 | (Ti0.15Cr0.65Mo0.1W0.02V0.08)0.5C0.5 | 4.3 | 120 OR MORE | 1809 | REJECTED |
| TEST PRODUCT 12 | (Ti0.1Cr0.75Mo0.05W0.05V0.05)0.5C0.5 | 3.5 | 120 OR MORE | 1990 | REJECTED |

| TEST PRODUCT | FILM STRUCTURE | FILM THICKNESS (μm) | GRAIN DIAMETER (nm) | MACHINED HOLE NUMBER | JUDGMENT |
|---|---|---|---|---|---|
| INVENTIVE PRODUCT 1 | (Ti0.7Cr0.01Mo0.19W0.05V0.05)0.5C0.25N0.2O0.05 | 10.0 | 90 OR LESS | 2500 | ACCEPTED |
| INVENTIVE PRODUCT 2 | (Ti0.65Cr0.05Mo0.2W0.05V0.05)0.5C0.2N0.25O0.05 | 9.4 | 90 OR LESS | 2822 | ACCEPTED |
| INVENTIVE PRODUCT 3 | (Ti0.6Cr0.05Mo0.25W0.05V0.05)0.5C0.15N0.3O0.05 | 8.3 | 90 OR LESS | 2400 | ACCEPTED |
| INVENTIVE PRODUCT 4 | (Ti0.55Cr0.1Mo0.25W0.05V0.05)0.5C0.1N0.39O0.01 | 7.4 | 90 OR LESS | 2510 | ACCEPTED |
| INVENTIVE PRODUCT 5 | (Ti0.5Cr0.1Mo0.3W0.05V0.05)0.5C0.05N0.37O0.08 | 7.2 | 90 OR LESS | 2580 | ACCEPTED |
| INVENTIVE PRODUCT 6 | (Ti0.5Cr0.1Mo0.35W0.02V0.03)0.52C0.05N0.4O0.03 | 7.6 | 90 OR LESS | 2507 | ACCEPTED |
| INVENTIVE PRODUCT 7 | (Ti0.5Cr0.1Mo0.35W0.02V0.03)0.52C0.03N0.42O0.03 | 7.6 | 90 OR LESS | 2810 | ACCEPTED |
| INVENTIVE PRODUCT 8 | (Ti0.47Cr0.01Mo0.5W0.01V0.01)0.52C0.02N0.32O0.14 | 7.1 | 90 OR LESS | 2703 | ACCEPTED |
| INVENTIVE PRODUCT 9 | (Ti0.45Cr0.03Mo0.5W0.01V0.01)0.52C0.01N0.32O0.15 | 5.8 | 90 OR LESS | 2590 | ACCEPTED |
| INVENTIVE PRODUCT 10 | (Ti0.4Cr0.08Mo0.5W0.01V0.01)0.47C0.15N0.3O0.08 | 5.5 | 90 OR LESS | 2800 | ACCEPTED |
| INVENTIVE PRODUCT 11 | (Ti0.4Cr0.05Mo0.45W0.05V0.05)0.47C0.23N0.25O0.05 | 5.5 | 90 OR LESS | 2810 | ACCEPTED |
| INVENTIVE PRODUCT 12 | (Ti0.45Cr0.01Mo0.45W0.05V0.04)0.47C0.29N0.13O0.11 | 5.9 | 90 OR LESS | 2600 | ACCEPTED |
| INVENTIVE PRODUCT 13 | (Ti0.4Cr0.06Mo0.45W0.04V0.05)0.47C0.35N0.15O0.03 | 5.1 | 60 OR LESS | 3100 | ACCEPTED |
| INVENTIVE PRODUCT 14 | (Ti0.35Cr0.15Mo0.45W0.02V0.03)0.58C0.2N0.2O0.02 | 5.4 | 60 OR LESS | 3150 | ACCEPTED |
| INVENTIVE PRODUCT 15 | (Ti0.3Cr0.2Mo0.45W0.02V0.03)0.58C0.2N0.2O0.02 | 5.3 | 40 OR LESS | 3210 | ACCEPTED |
| INVENTIVE PRODUCT 16 | (Ti0.25Cr0.25Mo0.45W0.01V0.04)0.68C0.15N0.15O0.02 | 5.1 | 60 OR LESS | 3090 | ACCEPTED |
| INVENTIVE PRODUCT 17 | (Ti0.2Cr0.35Mo0.35W0.05V0.05)0.68C0.05N0.25O0.02 | 4.1 | 40 OR LESS | 3200 | ACCEPTED |
| INVENTIVE PRODUCT 18 | (Ti0.2Cr0.4Mo0.35W0.01V0.04)0.41C0.42N0.1O0.07 | 5.1 | 60 OR LESS | 3010 | ACCEPTED |
| INVENTIVE PRODUCT 19 | (Ti0.35Cr0.26Mo0.35W0.02V0.02)0.41C0.42N0.1O0.07 | 4.3 | 90 OR LESS | 2800 | ACCEPTED |
| INVENTIVE PRODUCT 20 | (Ti0.45Cr0.08Mo0.45W0.01V0.01)0.43C0.04N0.45O0.08 | 4.0 | 90 OR LESS | 2480 | ACCEPTED |
| INVENTIVE PRODUCT 21 | (Ti0.55Cr0.1Mo0.25W0.05V0.05)0.43C0.02N0.46O0.09 | 4.0 | 60 OR LESS | 2901 | ACCEPTED |
| INVENTIVE PRODUCT 22 | (Ti0.5Cr0.1Mo0.3W0.05V0.05)0.49C0.25N0.25O0.01 | 4.8 | 90 OR LESS | 2700 | ACCEPTED |
| INVENTIVE PRODUCT 23 | (Ti0.5Cr0.1Mo0.35W0.02V0.03)0.49C0.25N0.25O0.01 | 4.8 | 60 OR LESS | 2909 | ACCEPTED |
| INVENTIVE PRODUCT 24 | (Ti0.5Cr0.05Mo0.4W0.02V0.03)0.49C0.15N0.3O0.06 | 4.6 | 90 OR LESS | 2508 | ACCEPTED |
| INVENTIVE PRODUCT 25 | (Ti0.47Cr0.01Mo0.5W0.01V0.01)0.49C0.2N0.2O0.11 | 4.5 | 60 OR LESS | 2900 | ACCEPTED |
| INVENTIVE PRODUCT 26 | (Ti0.45Cr0.03Mo0.5W0.01V0.01)0.51C0.2N0.25O0.04 | 4.2 | 60 OR LESS | 3001 | ACCEPTED |
| INVENTIVE PRODUCT 27 | (Ti0.4Cr0.08Mo0.5W0.01V0.01)0.51C0.1N0.32O0.07 | 3.4 | 60 OR LESS | 2980 | ACCEPTED |
| INVENTIVE PRODUCT 28 | (Ti0.4Cr0.05Mo0.45W0.05V0.05)0.51C0.05N0.4O0.04 | 5.3 | 60 OR LESS | 3010 | ACCEPTED |
| INVENTIVE PRODUCT 29 | (Ti0.45Cr0.01Mo0.45W0.05V0.04)0.51C0.01N0.37O0.11 | 5.1 | 60 OR LESS | 2989 | ACCEPTED |
| INVENTIVE PRODUCT 30 | (Ti0.4Cr0.06Mo0.45W0.04V0.05)0.51C0.3N0.15O0.04 | 3.5 | 60 OR LESS | 2891 | ACCEPTED |
| INVENTIVE PRODUCT 31 | (Ti0.35Cr0.15Mo0.45W0.02V0.03)0.47C0.4N0.1O0.03 | 3.4 | 60 OR LESS | 2910 | ACCEPTED |
| INVENTIVE PRODUCT 32 | (Ti0.3Cr0.2Mo0.45W0.02V0.03)0.47C0.3N0.2O0.03 | 3.3 | 60 OR LESS | 2800 | ACCEPTED |
| INVENTIVE PRODUCT 33 | (Ti0.25Cr0.25Mo0.45W0.01V0.04)0.47C0.2N0.25O0.08 | 3.3 | 60 OR LESS | 3010 | ACCEPTED |
| INVENTIVE PRODUCT 34 | (Ti0.2Cr0.35Mo0.35W0.05V0.05)0.47C0.1N0.4O0.03 | 3.5 | 40 OR LESS | 3290 | ACCEPTED |
| INVENTIVE PRODUCT 35 | (Ti0.2Cr0.4Mo0.35W0.01V0.04)0.47C0.1N0.42O0.01 | 4.1 | 60 OR LESS | 3100 | ACCEPTED |
| INVENTIVE PRODUCT 36 | (Ti0.35Cr0.26Mo0.35W0.02V0.02)0.53C0.05N0.4O0.02 | 4.2 | 60 OR LESS | 3120 | ACCEPTED |
| INVENTIVE PRODUCT 37 | (Ti0.45Cr0.08Mo0.45W0.01V0.01)0.53C0.01N0.4O0.06 | 6.0 | 60 OR LESS | 2900 | ACCEPTED |
| INVENTIVE PRODUCT 38 | (Ti0.65Cr0.2Mo0.1W0.02V0.03)0.53C0.3N0.1O0.07 | 6.9 | 90 OR LESS | 2200 | ACCEPTED |
| INVENTIVE PRODUCT 39 | (Ti0.6Cr0.2Mo0.12W0.03V0.05)0.53C0.29N0.17O0.01 | 6.4 | 60 OR LESS | 2560 | ACCEPTED |
| INVENTIVE PRODUCT 40 | (Ti0.55Cr0.33Mo0.05W0.02V0.05)0.53C0.15N0.2O0.12 | 6.3 | 60 OR LESS | 2700 | ACCEPTED |
| INVENTIVE PRODUCT 41 | (Ti0.5Cr0.4Mo0.05W0.04V0.01)0.5C0.2N0.25O0.05 | 5.1 | 60 OR LESS | 3122 | ACCEPTED |
| INVENTIVE PRODUCT 42 | (Ti0.45Cr0.4Mo0.1W0.03V0.02)0.5C0.12N0.3O0.08 | 5.9 | 40 OR LESS | 3200 | ACCEPTED |
| INVENTIVE PRODUCT 43 | (Ti0.7Cr0.01Mo0.19W0.05V0.05)0.5C0.05N0.4O0.05 | 5.4 | 60 OR LESS | 3100 | ACCEPTED |
| INVENTIVE PRODUCT 44 | (Ti0.65Cr0.05Mo0.2W0.05V0.05)0.51C0.1N0.3O0.09 | 5.0 | 60 OR LESS | 3001 | ACCEPTED |
| INVENTIVE PRODUCT 45 | (Ti0.2Cr0.2Mo0.5W0.05V0.05)0.51C0.17N0.17O0.15 | 2.0 | 60 OR LESS | 2800 | ACCEPTED |
| CONVENTIONAL PRODUCT 1 | (Ti0.1Cr0.7Mo0.1W0.02V0.08)0.5C0.2N0.3 | 9.8 | 200 OR MORE | 1400 | REJECTED |
| CONVENTIONAL PRODUCT 2 | (Ti0.8Cr0.1Mo0.03W0.02V0.05)0.5C0.25N0.25 | 8.3 | 200 OR MORE | 1201 | REJECTED |
| CONVENTIONAL PRODUCT 3 | (Ti0.45Cr0.5Mo0.05)0.5C0.1N0.4 | 7.5 | 150 OR MORE | 1200 | REJECTED |
| CONVENTIONAL PRODUCT 4 | (Ti0.5Cr0.4Mo0.1)0.5C0.05N0.45 | 4.5 | 150 OR MORE | 1390 | REJECTED |
| CONVENTIONAL PRODUCT 5 | (Ti0.5Cr0.49Mo0.01)0.5C0.025N0.475 | 4.1 | 150 OR MORE | 1029 | REJECTED |
| CONVENTIONAL PRODUCT 6 | (Ti0.45Cr0.5Mo0.05)0.5C0.005N0.495 | 5.9 | 150 OR MORE | 1309 | REJECTED |
| CONVENTIONAL PRODUCT 7 | (Ti0.35Cr0.6Mo0.05)0.5C0.005N0.495 | 4.1 | 200 OR MORE | 1200 | REJECTED |
| CONVENTIONAL PRODUCT 8 | Ti0.5C0.25N0.25 | 3.4 | 200 OR MORE | 1300 | REJECTED |
| TEST PRODUCT 1 | (Ti0.1Cr0.45Mo0.35W0.05V0.05)0.45C0.05N0.15O0.35 | 3.3 | 200 OR MORE | 1530 | REJECTED |
| TEST PRODUCT 2 | (Ti0.75Cr0.1Mo0.1W0.01V0.04)0.5C0.02N0.1O0.38 | 2.2 | 200 OR MORE | 1509 | REJECTED |
| TEST PRODUCT 3 | (Ti0.15Cr0.46Mo0.35W0.02V0.02)0.5C0.05N0.05O0.4 | 2.0 | 200 OR MORE | 1609 | REJECTED |
| TEST PRODUCT 4 | (Ti0.45Cr0.08Mo0.45W0.01V0.01)0.51C0.05N0.1O0.34 | 2.9 | 150 OR MORE | 1740 | REJECTED |
| TEST PRODUCT 5 | (Ti0.65Cr0.2Mo0.1W0.02V0.03)0.5C0.1N0.05O0.35 | 5.9 | 120 OR MORE | 1800 | REJECTED |
| TEST PRODUCT 6 | (Ti0.65Cr0.25Mo0.05W0.02V0.03)0.7N0.3 | 6.3 | 150 OR MORE | 1300 | REJECTED |
| TEST PRODUCT 7 | (Ti0.55Cr0.33Mo0.05W0.02V0.05)0.75C0.1N0.15 | 7.4 | 150 OR MORE | 1500 | REJECTED |
| TEST PRODUCT 8 | (Ti0.5Cr0.4Mo0.05W0.04V0.01)0.65C0.15N0.2 | 8.2 | 150 OR MORE | 1490 | REJECTED |
| TEST PRODUCT 9 | (Ti0.45Cr0.4Mo0.1W0.03V0.02)0.7C0.1N0.2 | 9.9 | 150 OR MORE | 1300 | REJECTED |
| TEST PRODUCT 10 | (Ti0.7Cr0.01Mo0.19W0.05V0.05)0.4C0.58N0.02 | 1.4 | 200 OR MORE | 1100 | REJECTED |

FIG.8

| TEST PRODUCT | FILM STRUCTURE | FILM THICKNESS (μm) | GRAIN DIAMETER (nm) | MACHINED HOLE NUMBER | JUDGMENT |
|---|---|---|---|---|---|
| INVENTIVE PRODUCT 1 | (Ti0.7Cr0.01Mo0.19W0.05V0.05)0.5N0.4O0.1 | 5.2 | 90 OR LESS | 2050 | ACCEPTED |
| INVENTIVE PRODUCT 2 | (Ti0.65Cr0.05Mo0.2W0.05V0.05)0.5N0.4O0.1 | 5.2 | 90 OR LESS | 2104 | ACCEPTED |
| INVENTIVE PRODUCT 3 | (Ti0.6Cr0.05Mo0.25W0.05V0.05)0.5N0.4O0.1 | 4.5 | 90 OR LESS | 2106 | ACCEPTED |
| INVENTIVE PRODUCT 4 | (Ti0.55Cr0.1Mo0.25W0.05V0.05)0.67N0.3100.02 | 4.5 | 90 OR LESS | 2201 | ACCEPTED |
| INVENTIVE PRODUCT 5 | (Ti0.5Cr0.1Mo0.3W0.05V0.05)0.67N0.3O0.03 | 4.3 | 90 OR LESS | 2600 | ACCEPTED |
| INVENTIVE PRODUCT 6 | (Ti0.5Cr0.1Mo0.35W0.02V0.03)0.68N0.28O0.04 | 4.1 | 60 OR LESS | 2930 | ACCEPTED |
| INVENTIVE PRODUCT 7 | (Ti0.5Cr0.1Mo0.35W0.02V0.03)0.68N0.22O0.1 | 4.0 | 40 OR LESS | 3300 | ACCEPTED |
| INVENTIVE PRODUCT 8 | (Ti0.47Cr0.01Mo0.5W0.01V0.01)0.55N0.4O0.05 | 4.2 | 40 OR LESS | 3400 | ACCEPTED |
| INVENTIVE PRODUCT 9 | (Ti0.45Cr0.03Mo0.5W0.01V0.01)0.55N0.4O0.05 | 4.8 | 60 OR LESS | 3100 | ACCEPTED |
| INVENTIVE PRODUCT 10 | (Ti0.4Cr0.08Mo0.5W0.01V0.01)0.55N0.4O0.05 | 4.9 | 40 OR LESS | 3240 | ACCEPTED |
| INVENTIVE PRODUCT 11 | (Ti0.4Cr0.05Mo0.45W0.05V0.05)0.52N0.45O0.03 | 4.2 | 40 OR LESS | 3204 | ACCEPTED |
| INVENTIVE PRODUCT 12 | (Ti0.45Cr0.01Mo0.45W0.05V0.04)0.52N0.45O0.03 | 7.0 | 60 OR LESS | 3100 | ACCEPTED |
| INVENTIVE PRODUCT 13 | (Ti0.4Cr0.06Mo0.45W0.04V0.05)0.52N0.4O0.08 | 7.0 | 60 OR LESS | 2999 | ACCEPTED |
| INVENTIVE PRODUCT 14 | (Ti0.35Cr0.15Mo0.45W0.02V0.03)0.52N0.43O0.05 | 8.0 | 60 OR LESS | 3010 | ACCEPTED |
| INVENTIVE PRODUCT 15 | (Ti0.3Cr0.2Mo0.45W0.02V0.03)0.5N0.4O0.1 | 9.5 | 60 OR LESS | 3033 | ACCEPTED |
| INVENTIVE PRODUCT 16 | (Ti0.25Cr0.25Mo0.45W0.01V0.04)0.5N0.4O0.1 | 7.5 | 60 OR LESS | 3090 | ACCEPTED |
| INVENTIVE PRODUCT 17 | (Ti0.2Cr0.35Mo0.35W0.05V0.05)0.5N0.42O0.08 | 5.4 | 60 OR LESS | 3020 | ACCEPTED |
| INVENTIVE PRODUCT 18 | (Ti0.2Cr0.4Mo0.35W0.01V0.04)0.5N0.42O0.08 | 6.0 | 60 OR LESS | 3100 | ACCEPTED |
| INVENTIVE PRODUCT 19 | (Ti0.35Cr0.26Mo0.35W0.02V0.02)0.48N0.45O0.07 | 4.5 | 60 OR LESS | 3020 | ACCEPTED |
| INVENTIVE PRODUCT 20 | (Ti0.45Cr0.07Mo0.45W0.01V0.02)0.48N0.46O0.06 | 3.7 | 60 OR LESS | 3010 | ACCEPTED |
| INVENTIVE PRODUCT 21 | (Ti0.55Cr0.1Mo0.25W0.05V0.05)0.48N0.42O0.1 | 4.9 | 60 OR LESS | 3044 | ACCEPTED |
| INVENTIVE PRODUCT 22 | (Ti0.5Cr0.1Mo0.3W0.05V0.05)0.48N0.42O0.1 | 5.6 | 60 OR LESS | 3017 | ACCEPTED |
| INVENTIVE PRODUCT 23 | (Ti0.5Cr0.1Mo0.35W0.02V0.03)0.45N0.48O0.07 | 5.0 | 40 OR LESS | 3221 | ACCEPTED |
| INVENTIVE PRODUCT 24 | (Ti0.5Cr0.05Mo0.4W0.02V0.03)0.45N0.48O0.07 | 4.6 | 60 OR LESS | 3120 | ACCEPTED |
| INVENTIVE PRODUCT 25 | (Ti0.47Cr0.01Mo0.5W0.01V0.01)0.45N0.42O0.13 | 5.3 | 40 OR LESS | 3400 | ACCEPTED |
| INVENTIVE PRODUCT 26 | (Ti0.45Cr0.03Mo0.5W0.01V0.01)0.45N0.49O0.06 | 4.9 | 60 OR LESS | 3312 | ACCEPTED |
| INVENTIVE PRODUCT 27 | (Ti0.4Cr0.08Mo0.5W0.01V0.01)0.42N0.48O0.1 | 4.6 | 60 OR LESS | 3167 | ACCEPTED |
| INVENTIVE PRODUCT 28 | (Ti0.4Cr0.05Mo0.45W0.05V0.05)0.48N0.46O0.06 | 6.2 | 60 OR LESS | 3199 | ACCEPTED |
| INVENTIVE PRODUCT 29 | (Ti0.45Cr0.01Mo0.45W0.05V0.04)0.48N0.48O0.04 | 5.4 | 60 OR LESS | 2993 | ACCEPTED |
| INVENTIVE PRODUCT 30 | (Ti0.4Cr0.06Mo0.45W0.04V0.05)0.48N0.46O0.06 | 6.0 | 60 OR LESS | 3001 | ACCEPTED |
| INVENTIVE PRODUCT 31 | (Ti0.35Cr0.15Mo0.45W0.02V0.03)0.5N0.49O0.01 | 6.9 | 40 OR LESS | 3211 | ACCEPTED |
| INVENTIVE PRODUCT 32 | (Ti0.3Cr0.2Mo0.45W0.02V0.03)0.5N0.48O0.02 | 7.2 | 40 OR LESS | 3317 | ACCEPTED |
| INVENTIVE PRODUCT 33 | (Ti0.25Cr0.25Mo0.45W0.01V0.04)0.5N0.48O0.02 | 7.2 | 60 OR LESS | 3109 | ACCEPTED |
| INVENTIVE PRODUCT 34 | (Ti0.2Cr0.35Mo0.35W0.05V0.05)0.5N0.46O0.04 | 7.0 | 40 OR LESS | 3200 | ACCEPTED |
| INVENTIVE PRODUCT 35 | (Ti0.2Cr0.4Mo0.35W0.01V0.04)0.52N0.47O0.01 | 7.0 | 60 OR LESS | 3010 | ACCEPTED |
| INVENTIVE PRODUCT 36 | (Ti0.35Cr0.26Mo0.35W0.02V0.02)0.52N0.45O0.03 | 5.3 | 40 OR LESS | 3601 | ACCEPTED |
| INVENTIVE PRODUCT 37 | (Ti0.45Cr0.07Mo0.45W0.01V0.02)0.52N0.46O0.02 | 6.3 | 40 OR LESS | 3503 | ACCEPTED |
| INVENTIVE PRODUCT 38 | (Ti0.65Cr0.2Mo0.1W0.02V0.03)0.52N0.45O0.03 | 4.7 | 60 OR LESS | 2939 | ACCEPTED |
| INVENTIVE PRODUCT 39 | (Ti0.6Cr0.25Mo0.1W0.02V0.03)0.53N0.42O0.05 | 5.4 | 90 OR LESS | 2899 | ACCEPTED |
| INVENTIVE PRODUCT 40 | (Ti0.55Cr0.33Mo0.05W0.02V0.05)0.51N0.48O0.01 | 6.8 | 60 OR LESS | 2700 | ACCEPTED |
| INVENTIVE PRODUCT 41 | (Ti0.5Cr0.4Mo0.05W0.04V0.01)0.52N0.34O0.14 | 4.2 | 90 OR LESS | 2610 | ACCEPTED |
| INVENTIVE PRODUCT 42 | (Ti0.45Cr0.4Mo0.1W0.03V0.02)0.53N0.32O0.15 | 4.0 | 60 OR LESS | 2992 | ACCEPTED |
| INVENTIVE PRODUCT 43 | (Ti0.7Cr0.01Mo0.19W0.05V0.05)0.5N0.49O0.01 | 4.9 | 60 OR LESS | 3001 | ACCEPTED |
| INVENTIVE PRODUCT 44 | (Ti0.65Cr0.05Mo0.2W0.05V0.05)0.5N0.49O0.01 | 6.0 | 60 OR LESS | 3071 | ACCEPTED |
| INVENTIVE PRODUCT 45 | (Ti0.2Cr0.2Mo0.5W0.05V0.05)0.5N0.48O0.02 | 6.3 | 60 OR LESS | 3102 | ACCEPTED |
| CONVENTIONAL PRODUCT 1 | (Ti0.8Cr0.05Mo0.05W0.02V0.08)0.5N0.5 | 2.1 | 120 OR MORE | 1939 | REJECTED |
| CONVENTIONAL PRODUCT 2 | (Ti0.75Cr0.15Mo0.05W0.02V0.03)0.5N0.5 | 2.9 | 120 OR MORE | 1802 | REJECTED |
| CONVENTIONAL PRODUCT 3 | (Ti0.55Cr0.4Mo0.05)0.5N0.5 | 9.8 | 150 OR MORE | 1500 | REJECTED |
| CONVENTIONAL PRODUCT 4 | (Ti0.5Cr0.4Mo0.1)0.5N0.5 | 3.1 | 150 OR MORE | 1290 | REJECTED |
| CONVENTIONAL PRODUCT 5 | (Ti0.5Cr0.49Mo0.01)0.5N0.5 | 5.3 | 150 OR MORE | 1700 | REJECTED |
| CONVENTIONAL PRODUCT 6 | (Ti0.45Cr0.5Mo0.05)0.5N0.5 | 8.8 | 120 OR MORE | 1900 | REJECTED |
| CONVENTIONAL PRODUCT 7 | (Ti0.35Cr0.55Mo0.1)0.5N0.5 | 3.5 | 150 OR MORE | 1740 | REJECTED |
| CONVENTIONAL PRODUCT 8 | Ti0.5N0.5 | 2.5 | 200 OR MORE | 1000 | REJECTED |
| TEST PRODUCT 1 | (Ti0.1Cr0.45Mo0.35W0.05V0.05)0.5N0.1O0.4 | 6.0 | 150 OR MORE | 1501 | REJECTED |
| TEST PRODUCT 2 | (Ti0.15Cr0.45Mo0.35W0.01V0.04)0.48N0.12O0.4 | 8.0 | 150 OR MORE | 1400 | REJECTED |
| TEST PRODUCT 3 | (Ti0.15Cr0.46Mo0.35W0.02V0.02)0.52N0.11O0.37 | 0.1 | 200 OR MORE | 1047 | REJECTED |
| TEST PRODUCT 4 | (Ti0.45Cr0.07Mo0.45W0.01V0.02)0.5N0.1O0.4 | 10 | 200 OR MORE | 1041 | REJECTED |
| TEST PRODUCT 5 | (Ti0.65Cr0.2Mo0.1W0.02V0.03)0.51N0.1O0.39 | 9.0 | 150 OR MORE | 1301 | REJECTED |
| TEST PRODUCT 6 | (Ti0.6Cr0.25Mo0.1W0.02V0.03)0.5N0.15O0.35 | 3.4 | 150 OR MORE | 1400 | REJECTED |
| TEST PRODUCT 7 | (Ti0.55Cr0.33Mo0.05W0.02V0.05)0.49N0.13O0.38 | 10.5 | 200 OR MORE | 1010 | REJECTED |
| TEST PRODUCT 8 | (Ti0.5Cr0.4Mo0.05W0.04V0.01)0.5N0.5 | 0.5 | 200 OR MORE | 1000 | REJECTED |
| TEST PRODUCT 9 | (Ti0.45Cr0.4Mo0.1W0.03V0.02)0.5N0.5 | 3.5 | 200 OR MORE | 1040 | REJECTED |
| TEST PRODUCT 10 | (Ti0.7Cr0.01Mo0.19W0.05V0.05)0.5N0.5 | 2.9 | 200 OR MORE | 1070 | REJECTED |

HARD FILM FOR MACHINING TOOLS AND HARD FILM-COATED METAL MACHINING TOOL

TECHNICAL FIELD

The present invention relates to a tool hard film that is to be disposed as coating on a surface of a metal machining tool and a metal machining tool, and particularly to a technique of increasing the lubricity thereof while maintaining the abrasion resistance, the welding resistance, and the oxidation resistance.

BACKGROUND ART

Surfaces of metal machining tools including cutting tools for machining a work piece by cutting such as drills and taps and rolling tools for machining a work piece by plastic deformation such as rolling taps, are coated with tool hard films for improving the abrasion resistance. TiN-based, TiAlN-based and AlCrN-based coatings are widely used for the tool hard films and improvements are achieved for further increasing the performance thereof. For example, this corresponds to a hard laminated film described in Patent Document 1. However, an oxidization property and welding resistance are still insufficient and the tool life may be reached relatively early depending on a type of work material and a cutting condition.

In this regard, a single layer cutting tool hard film made of a nitride or carbonitride of $Ti_aCr_bAl_cMo_{1-a-b-c}$ is proposed in Patent Document 2. It is described in Patent Document 2 that when the atom ratios are set within ranges of $0.2 \leq a \leq 0.7$, $0.01 \leq b \leq 0.2$, $0.01 \leq c \leq 0.2$, and $0.1 \leq (1-a-b-c)$ and the total film thickness is set within a range of 0.2 μm≤total film thickness≤10.0 μm, a cutting tool hard film having both the abrasion resistance and the welding resistance is acquired.

PRIOR ART DOCUMENT

Patent Documents

Patent Document 1: Japanese Laid-Open Patent Publication No. 2006-336032
Patent Document 2: Japanese Laid-Open Patent Publication No. 2012-115923

SUMMARY OF THE INVENTION

Problem to be Solved by the Invention

However, the conventional hard film described in Patent Document 2 may not sufficiently provide the durability of metal machining tools and still has room for improvement. Such a conventional hard film has a problem that smoothness, i.e., a low friction property, of a surface is not sufficiently provided because of relatively large crystal grains although the abrasion resistance and the welding resistance are provided. Therefore, it has been required to develop a tool hard film excellent in abrasion resistance and welding resistance as well as smoothness.

The present invention was conceived in view of the situations and it is therefore an object of the present invention to provide a tool hard film excellent in abrasion resistance and welding resistance as well as smoothness.

Means for Solving Problem

As a result of various studies in view of the situations, the present inventors found out that when oxygen is introduced at the time of generation of a hard film of a TiCrMoWV-based carbide, nitride, or carbonitride having a phase with a NaCl-type crystal structure as a main phase, fine crystal grains make up the hard film and smoothen the surface thereof, providing the hard film with the abrasion resistance improved due to a low friction coefficient. The present invention was conceived based on such a knowledge.

That is, the principle of the present invention provides a tool hard film that is to be disposed as coating on a surface of a tool, the tool hard film being a TiCrMoWV oxycarbide, oxynitride, or oxycarbonitride having a phase with a NaCl-type crystal structure as a main phase, the oxycarbide, oxynitride, or oxycarbonitride having fine crystals due to introduction of oxygen.

Effects of the Invention

According to the tool hard film of the present invention as constructed above, since the TiCrMoWV oxycarbide, oxynitride, or oxycarbonitride having a phase with a NaCl-type crystal structure as a main phase has fine crystals due to introduction of oxygen and therefore provides an extremely smooth surface and a low friction coefficient of the hard film, the tool hard film having the abrasion resistance and the welding resistance as well as the smoothness is acquired. Because the tool hard film has the excellent smoothness and the low friction coefficient, the tool life is elongated.

In a first preferred form of the invention, the TiCrMoWV oxycarbide is represented by $(Ti_aCr_bMo_cW_dV_e)_{1-x-y}C_xO_y$, and atom ratios thereof are $0.2 \leq a \leq 0.7$, $0.01 \leq b \leq 0.4$, $0.05 \leq c \leq 0.5$, $0 \leq d \leq 0.05$, $0 \leq e = 1-a-b-c-d \leq 0.05$, $0.3 \leq x+y \leq 0.6$, and $0 \leq y \leq 0.15$. Consequently, since the crystals making up the hard film become fine and make the surface of the hard film extremely smooth, the tool hard film having the abrasion resistance and the welding resistance as well as the smoothness is acquired. If the oxycarbide is out of the numerical value ranges of the atom ratios, sufficient abrasion resistance and welding resistance are not provided and the tool life may be shortened. The atom ratio a of Ti less than 0.2 softens the hard film, while the atom ratio a exceeding 0.7 reduces Mo and W, resulting in deteriorated welding resistance. If the atom ratio b of Cr is less than 0.01, the oxidation resistance is not provided, while the atom ratio b exceeding 0.4 makes the hard film fragile. If the atom ratio c of Mo is less than 0.05, the welding resistance is not provided, while the atom ratio c exceeding 0.5 makes the amount of Ti lower than 0.2, resulting in softening of the hard film. Although the atom ratio d of W must exceed 0 since W is an element essential for increased lubricity, the atom ratio d exceeding 0.5 softens the hard film. Although the atom ratio e of V must exceed 0 since V is an element essential for increased lubricity, the atom ratio e exceeding 0.05 increases amorphous and therefore softens the hard film. The atom ratio x+y of C and O less than 0.3 disables the crystals of the hard film from becoming small and the hard film from becoming hard, while the atom ratio x+y exceeding 0.6 leads to the formation of amorphous and disables the hard film from becoming hard. Although O is essential for making the hard film hard and the crystal grains small, the atom ratio y of O exceeding 0.15 leads to the formation of amorphous, resulting in softening.

In a second preferred form of the invention, the TiCrMoWV oxycarbonitride is represented by $(Ti_aCr_bMo_cW_dV_e)_{1-x-y-z}C_xN_yO_z$, and atom ratios thereof are $0.2 \leq a \leq 0.7$, $0.01 \leq b \leq 0.4$, $0.05 \leq c \leq 0.5$, $0 \leq d \leq 0.05$, $0 \leq e = 1-a-b-c-d \leq 0.05$, $0.3 \leq x+y+z \leq 0.6$, $0 \leq y \leq 0.5$, and $0 \leq z \leq 0.15$. Consequently, since the crystals making up the hard film become fine and make the surface of the hard film extremely smooth, the tool hard film having the abrasion resistance and the welding resistance as well as the smoothness is acquired. The atom ratio a of Ti less than 0.2 softens the hard film, while the atom ratio a exceeding 0.7 reduces Mo and W, resulting in deteriorated welding resistance. If the atom ratio b of Cr is less than 0.01, the oxidation resistance is not provided, while the atom ratio b exceeding 0.4 makes the hard film fragile. If the atom ratio c of Mo is less than 0.05, the MoO welding resistance is not provided, while the atom ratio c exceeding 0.5 makes the amount of Ti lower than 0.2, resulting in softening of the hard film. Although the atom ratio d of W must exceed 0 since W is an element essential for increased lubricity, the atom ratio d exceeding 0.5 softens the hard film. Although the atom ratio e of V must exceed 0 since V is an element essential for increased lubricity, the atom ratio e exceeding 0.05 increases amorphous and therefore softens the hard film. The atom ratio x+y+z of C, N, and O less than 0.3 disables the crystals of the hard film from becoming small and the hard film from becoming hard, while the atom ratio x+y+z exceeding 0.6 leads to the formation of amorphous and disables the hard film from becoming hard. Although N is essential for making the hard film hard, the atom ratio y of N exceeding 0.5 reduces C and disables the hard film from becoming hard. Although 0 is essential for making the hard film hard and the crystal grains small, the atom ratio z of O exceeding 0.15 leads to the formation of amorphous, resulting in softening.

In a third preferred form of the invention, the TiCrMoWV oxynitride is represented by $(Ti_aCr_bMo_cW_dV_e)_{1-x-y}N_xO_y$, and atom ratios thereof are $0.2 \leq a \leq 0.7$, $0.01 \leq b \leq 0.4$, $0.05 \leq c \leq 0.5$, $0 \leq d \leq 0.05$, $0 \leq e = 1-a-b-c-d \leq 0.05$, $0.3 \leq x+y \leq 0.6$, and $0 \leq y \leq 0.15$. Consequently, since the crystals making up the hard film become fine and make the surface of the hard film extremely smooth, the tool hard film having the abrasion resistance and the welding resistance as well as the smoothness is acquired. The atom ratio a of Ti less than 0.2 softens the hard film, while the atom ratio a exceeding 0.7 reduces Mo and W, resulting in deteriorated welding resistance. If the atom ratio b of Cr is less than 0.01, the oxidation resistance is not provided, while the atom ratio b exceeding 0.4 makes the hard film fragile. If the atom ratio c of Mo is less than 0.05, the welding resistance is not provided, while the atom ratio c exceeding 0.5 makes the amount of Ti lower than 0.2, resulting in softening of the hard film. Although the atom ratio d of W must exceed 0 since W is an element essential for increased lubricity, the atom ratio d exceeding 0.05 softens the hard film. Although the atom ratio e of V must exceed 0 since V is an element essential for increased lubricity, the atom ratio e exceeding 0.05 increases amorphous and therefore softens the hard film. The atom ratio x+y of N and O less than 0.3 disables the crystals of the hard film from becoming small and the hard film from becoming hard, while the atom ratio x+y exceeding 0.6 increases amorphous and disables the hard film from becoming hard. Although O is essential for making the hard film hard and the crystal grains small, the atom ratio y of O exceeding 0.15 leads to the formation of amorphous and disables the hard film from becoming hard.

In a fourth preferred form of the invention, the tool hard film is a 0.2 to 10.0 μm thick single layer coating a surface of a tool substrate. Consequently, the tool hard film with high abrasion resistance and welding resistance as well as smoothness can be acquired in fewer processes and, therefore, the tool becomes inexpensive. If the film thickness of the tool hard film is less than 0.2 μm, sufficient abrasion resistance and welding resistance may not be acquired, while if the film thickness exceeds 10.0 μm, toughness is reduced and chipping, exfoliation, etc. may easily occur. By setting the film thickness within a range of 0.2 μm or more and 10.0 μm or less, the hard film can be constructed to have thickness necessary and sufficient for assuring abrasion resistance and welding resistance and to hardly cause chipping, exfoliation, etc.

Preferably, the tool hard film may have multiple layers laminated on a surface of a tool substrate. In this case, all of the multiple layers do not necessarily have to be the tool hard film of the present invention as long as at least the top layer is the tool hard film of the present invention.

Preferably, since the tool hard film is disposed as coating on the surface of the tool substrate, making Mo, W, and V contained in the film leads to the formation of an oxide containing Mo, W, and V having a low friction coefficient on the film surface due to abrasion and oxidation, and a high hardness film excellent in welding resistance can be acquired. Therefore, a hard-film-coated cutting tool can be provided that is excellent in abrasion resistance and welding resistance as well as smoothness.

Preferably, the tool hard film of the present invention is preferably applied to surface coating of various metal machining tools including rolling taps for plastic forming of metal, and rotary cutting tools such as end mills, drills, face mills, forming mills, reamers, and cut taps for machining metal by cutting, as well as non-rotary cutting tools such as lathe tool, and dies. Although cemented carbide and high speed tool steel are preferably used as a tool substrate, i.e., a material of a member to be provided with the hard film, other materials also can be used and the tool hard film of the present invention is widely applied to metal machining tools made of various materials.

Preferably, the tool hard film of the present invention is disposed as coating of a partial or entire surface of a tool, and is preferably disposed on a cutting portion or a plastic forming portion involved with metal machining in the tool.

Although a sputtering method is preferably used as a method of forming the tool hard film of the present invention, other physical vapor deposition methods (PVD methods) such as an arc ion plating method and chemical vapor deposition methods such as a plasma CVD method and a thermal CVD method are also usable.

MODE FOR CARRYING OUT THE INVENTION

A preferred embodiment of the present invention will now be described in detail with reference to the drawings.

Embodiment

Figure 1:
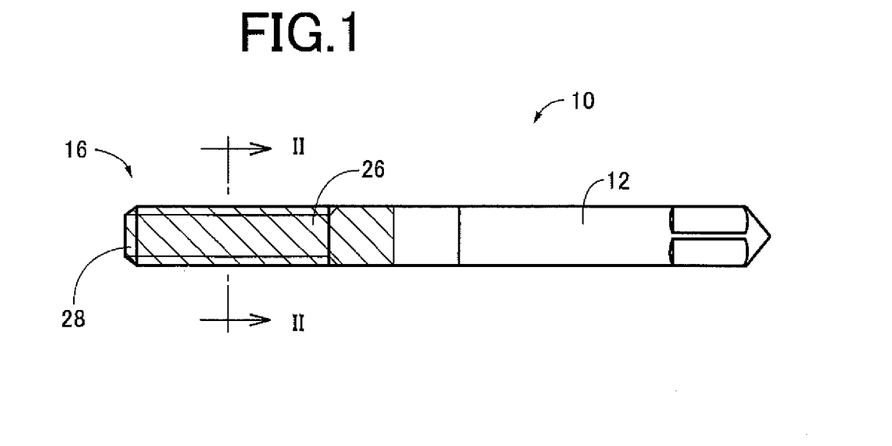
FIG. 1 is a front view of a rolling tap that is an example of a tool coated with a hard film of an embodiment of the present invention, as viewed from a direction perpendicular to an axial center of the tap.
Figure 2:
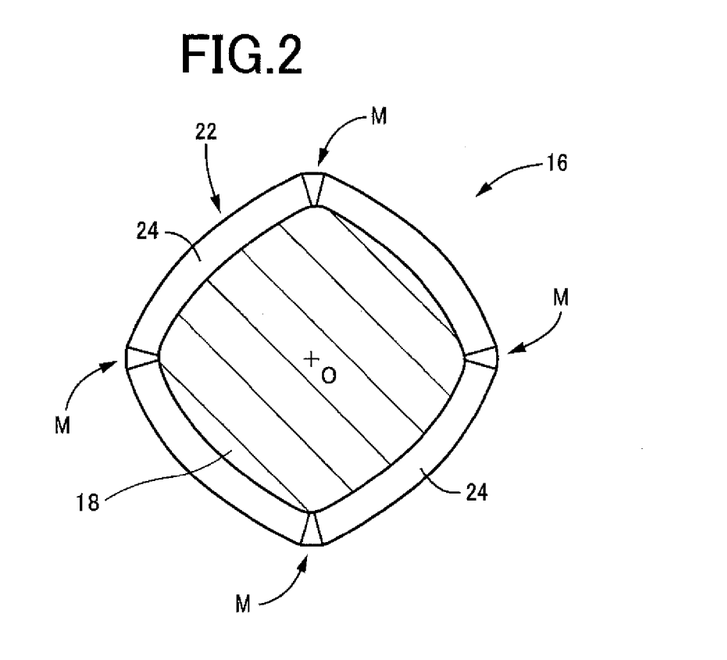
FIG. 2 is a cross-sectional view of a machining portion of the rolling tap of FIG. 1, where the machining portion is coated with a tool hard film of the present invention by way of example.

FIG. 1 is a front view of a rolling tap 10 that is an example of a coated metal machining tool to which a tool hard film 30 of the present invention is applied, as viewed from a direction perpendicular to an axial center of the tap 10. FIG. 2 is an enlarged cross-sectional view of a cross section taken along II-II of FIG. 1. As depicted in FIGS. 1 and 2, the rolling tap 10 of this embodiment coaxially integrally includes a shank 12 that is to be attached to a spindle via a chuck (not depicted) and a machining portion 16 that is to be screwed into a prepared hole to form an internal thread and a tool substrate (base material) 18 is made of high speed tool steel. This high speed tool steel is, for example, high speed tool steel corresponding to SKH58 prescribed in JIS, and the contained components and the ratios are as follows: C: 1.0, Cr: 4.0, Mo: 8.8, W: 1.8. V: 2.0, and the balance: substantially Fe.

The machining portion 16 has a cross section of a polygonal prism shape, or a substantially quadrangular prism shape in this embodiment, having the sides curved outward, and is provided with an external thread 22 for cutting into and plastically deforming a surface layer portion of a prepared hole of a metal work piece for forming, i.e., rolling, of an internal thread. A ridge of the external thread 22 has a cross-sectional shape corresponding to a shape of a groove of an internal thread to be formed, and has a constant height dimension along a helix having a lead angle corresponding to a lead angle of the internal thread. In particular, the machining portion 16 is provided with four margin portions M in which the thread ridge of the external thread 22 protrudes outward in the radial direction for machining the internal thread and four relief portions 24 defining a diameter smaller than a diameter defined by the margin portions M such that these portions are lined in the axial direction in parallel with an axial center O and arranged alternately at regular angular intervals around the axial center O. The dimension of the margin portion M is set to the same dimension as the internal thread to be formed or is set larger than the internal thread in consideration of elastic restoration from plastic deformation. The machining portion 16 includes a complete thread portion 26 having a diameter dimension of the thread which is constant in the axial direction and a chamfered portion 28 having a diameter dimension which is reduced in a direction toward the distal end. FIG. 2 is a cross-sectional view taken along the helix at a root of the external thread 22.

Figure 3:
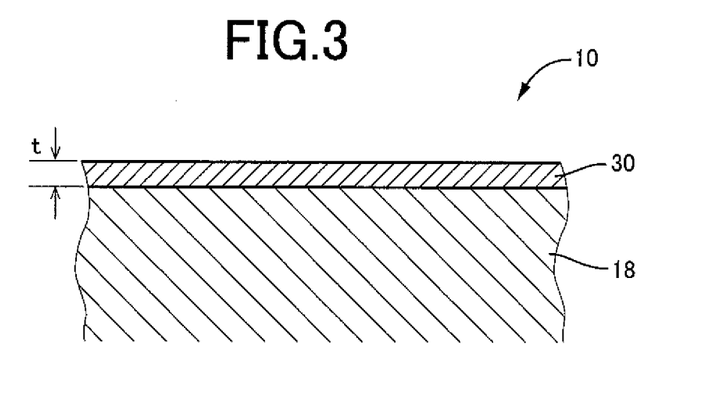
FIG. 3 is an enlarged cross-sectional view of the surface of the machining portion coated with the tool hard film of FIG. 2.

The machining portion 16 of the rolling tap 10 is coated with a 0.2 to 10.0 μm thick single layer of the hard film 30 excellent in abrasion resistance, welding resistance, and smoothness. FIG. 3 is an enlarged cross-sectional view of a surface portion of the rolling tap 10 having the surface of the machining portion 16 of the rolling tap 10 coated with the hard film 30 of a predetermined film thickness t. A shaded portion of FIG. 1 indicates a portion provided with the hard film 30 of the rolling tap 10. The hard film 30 is caused to be in friction with a metal work piece under relatively high pressure that plastically deforms an inner circumferential surface of a prepared hole at the time of rolling for forming an internal thread in the inner circumferential surface of the prepared hole by the rolling tap 10.

The hard film 30 is made of a TiCrMoWV oxycarbide $(Ti_aCr_bMo_cW_dV_e)_{1-x-y}C_xO_y$, a TiCrMoWV oxycarbonitride $(Ti_aCr_bMo_cW_dV_e)_{1-x-y-z}C_xN_yO_z$, or a TiCrMoWV oxynitride $(Ti_aCr_bMo_cW_dV_e)_{1-x-y}N_xO_y$ having fine crystals of 100 nm or less due to introduction of oxygen and a phase with a NaCl-type crystal structure as a main phase.

Figure 4:
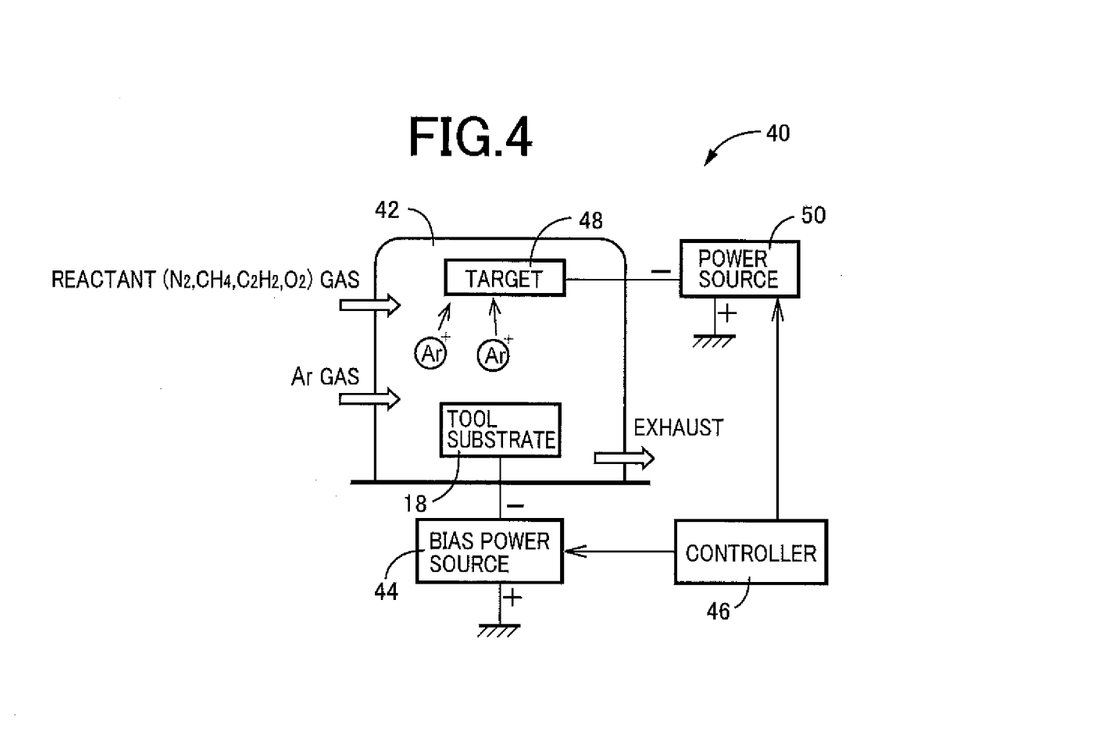
FIG. 4 is a general configuration diagram for explaining a sputtering apparatus preferably used for forming the tool hard film of FIGS. 1 to 3.

FIG. 4 is a general configuration diagram (schematic) for explaining a sputtering apparatus 40 preferably used for forming the hard film 30 of this embodiment. In a sputtering process by the sputtering apparatus 40, a constant negative bias voltage (e.g., about −50 to −60 V) is applied by a power source 50 to a target 48 containing the elements Ti, Cr, Mo, W, and V making up the hard film 30 while a constant negative bias voltage (e.g., about −100 V) is applied by a bias power source 44 to the tool substrate 18 so as to cause the argon ions Ar+ to collide with the target 48, thereby beating out the constituent elements such as Ti, Cr, Mo, W, and V. The voltages applied by the power source 50 and the bias power source 44 are controlled by a controller 46. Pressure in a chamber 42 is controlled to about 0.5 Pa, for example, and reactant gas such as nitrogen gas (N2), hydrocarbon gas (CH4, C2H2), and oxygen gas (O2) is selectively introduced in addition to argon gas into the chamber 42 at a predetermined flow rate of about 100 ml/min, for example, so that nitrogen atoms N, carbon atoms C, or oxygen atoms O combine with Ti, Cr, Mo, W, and V beaten out from the target 48 to form TiN, TiCN, TiO, MoO, etc., which are attached as the hard film 30 to the surface of the tool substrate 18 with a predetermined thickness.

[Durability Evaluation Test 1]

Figure 5:
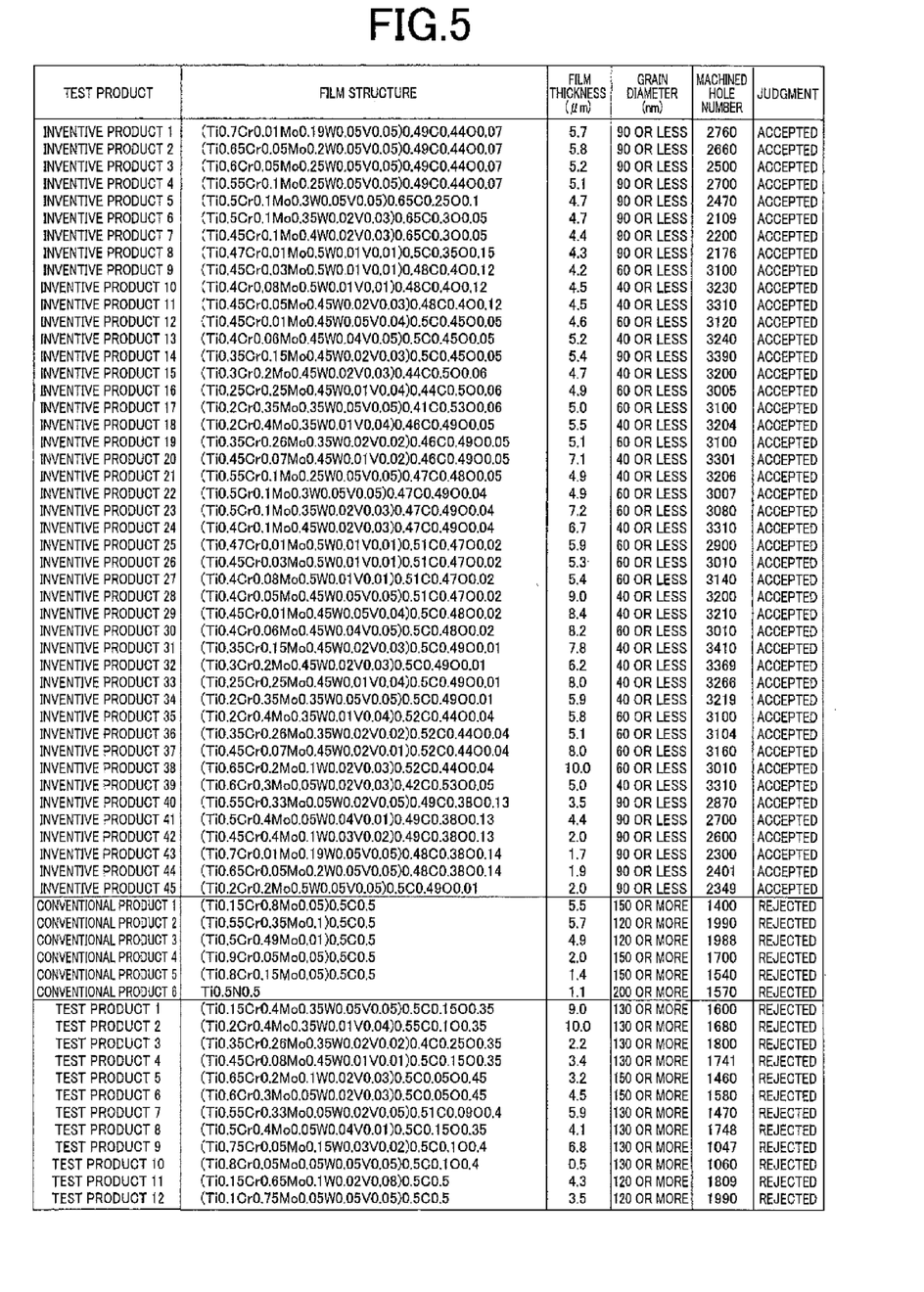
FIG. 5 is a chart illustrating atomic composition, film thickness of the hard film and the durability test results (machined hole numbers and judgments) for each of the test taps used in a durability evaluation test 1, where the durability evaluation test 1 evaluates the durability of the tool hard film of FIGS. 1 to 3 made of the TiCrMoWV oxycarbide.

Description will be made of a durability evaluation test conducted by the present inventors for verifying the effect of the abrasion resistance, welding resistance, and smoothness of the hard film 30 made of the TiCrMoWV oxycarbide having fine crystals of 100 nm or less due to introduction of oxygen and a phase with a NaCl-type crystal structure as a main phase. The present inventors prepared test taps (inventive products 1 to 45, conventional products 1 to 6, and test (comparison) products 1 to 12) by coating rolling taps having a tool diameter of 6 (mmø) with a plurality of types of hard films different in atomic composition and film thickness t depicted in FIG. 5, and evaluated each of the test taps by performing thread rolling under the following rolling conditions. FIG. 5 is a chart of a plurality of types of the hard films different in the atomic composition and the film thickness t attached to cover the test taps used in the durability evaluation test 1 and the durability test results (machined hole numbers and judgments) of the test taps. The test taps include the conventional products 1 to 6 acquired by using the hard films containing Ti without containing W, V, and O and the test products 1 to 12 acquired by using the hard films containing the same metal elements (Ti, Cr, Mo, W, and V) as the inventive products as well as C and O at atom ratios that are deviated from the ranges of the inventive products.

[Thread Rolling Conditions]
Machine: vertical machining center
Test product: high-speed rolling tap with a tool diameter of 6 (mmø)
Work material: S45C (JIS standard)
Cutting method: internal thread forming
Cutting speed: 15 (m/min)
Machining depth: 12 mm (prepared hole: 16 mm blind hole)
Cutting oil: water-soluble In FIG. 5, a rolled internal thread within a standard is defined as an accepted hole and a test tap capable of machining 2000 or more accepted holes is evaluated as an accepted product. All the inventive products 1 to 45 are evaluated as the accepted products and the conventional products 1 to 6 and the test products 1 to 12 are all evaluated as rejected products. The hard films of the inventive products 1 to 45 evaluated as the accepted products are TiCrMoWV oxycarbides within a range of 1.7 to 10.0 μm with chemical compositions represented by $(Ti_aCr_bMo_cW_dV_e)_{1-x-y}C_xO_y$, and have the atom ratios represented by $0.2 \leq a \leq 0.7$, $0.01 \leq b \leq 0.4$, $0.05 \leq c \leq 0.5$, $0 \leq d \leq 0.05$, $0 \leq e = 1-a-b-c-d \leq 0.05$, $0.3 \leq x+y \leq 0.6$, and $0 \leq y \leq 0.15$. This leads to fine crystals making up the hard film and an extremely smooth surface of the hard film and, therefore, the machining tool hard film having abrasion resistance and welding resistance as well as smoothness is acquired.

Figure 6:
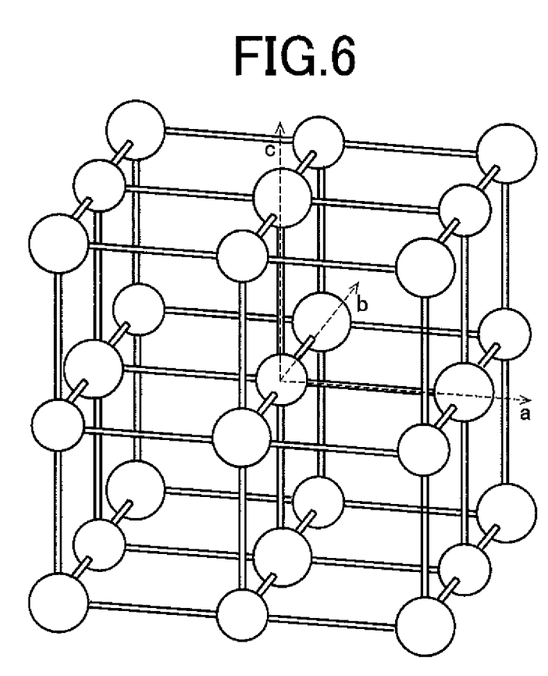
FIG. 6 is a diagram illustrating a NaCl-type crystal structure of the tool hard film of FIGS. 1 to 3 as a main phase.

The crystal grain diameters of the hard films formed on the surfaces of the test taps were evaluated by structure observation using a TEM (transmission electron microscope). Since the crystal grains have a shape extending in the direction perpendicular to the substrate surface, the cross section of the hard film was imaged by using the TEM and the dimension of the width parallel to the substrate surface of the crystal extending in the perpendicular direction was measured at ten points to measure the average value as the crystal grain diameter of the hard film of each of the test taps. The inventive products 1 to 45 exhibited fine crystal grains of 40 to 90 nm. On the other hand, the conventional products 1 to 6 and the test products 1 to 12 exhibited at least 120 nm or more and all had values exceeding 100 mm. The oxygen O introduced in the sputtering process is considered to be basically disposed at an atom site of a portion in the NaCl-type crystal structure depicted in FIG. 6 (a portion of a site of a small atom in a crystal structure depicted in FIG. 6), and it is estimated that the finer crystal grains are caused partially because the uneven distribution of oxygen at crystal grain boundaries suppresses grain growth and reduces the crystal grain diameter of the hard film. It is estimated that this fine crystal grain diameter reduces the friction coefficient and increases the lubricity of the hard film, contributing to the elongation of the durability life of the rolling taps.

Figure 7:
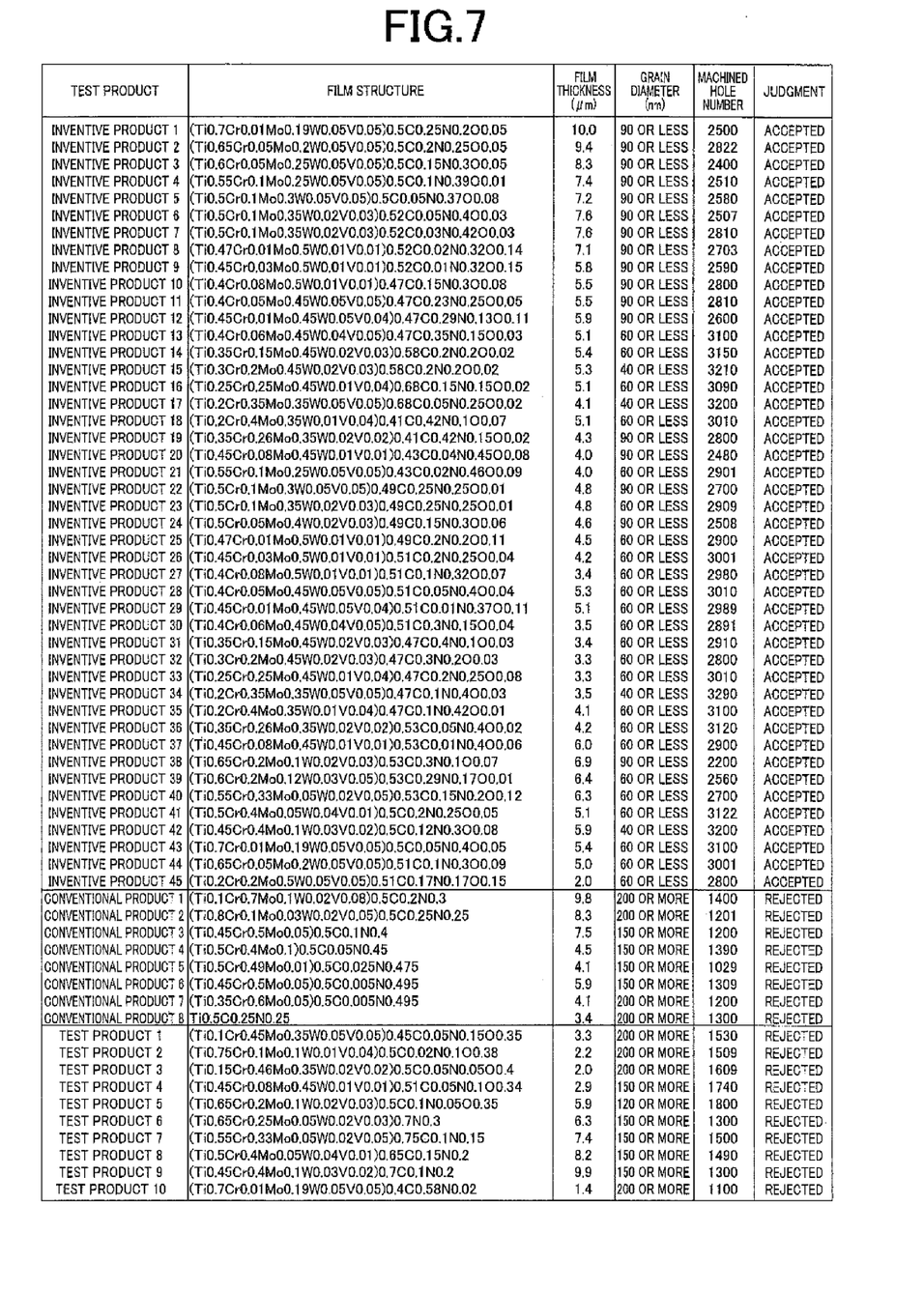
FIG. 7 is a chart illustrating atomic composition, film thickness of the hard film and the durability test results (machined hole numbers and judgments) for each of the test taps used in a durability evaluation test 2, where the durability evaluation test 2 evaluates the durability of the tool hard film of FIGS. 1 to 3 made of the TiCrMoWV oxycarbonitride.

[Durability Evaluation Test 2]
Description will be made of a durability evaluation test 2 conducted by the present inventors for verifying the effect of the abrasion resistance, welding resistance, and smoothness of the hard film 30 made of the TiCrMoWV oxycarbonitride having fine crystals due to introduction of oxygen and a phase with a NaCl-type crystal structure as a main phase. The present inventors prepared test taps (inventive products 1 to 45, conventional products 1 to 8, and test (comparison) products 1 to 10) by coating rolling taps having a tool diameter of 6 (mmø) with a plurality of types of hard films different in atomic composition and film thickness t depicted in FIG. 7, and evaluated each of the test taps by performing thread rolling under the above-mentioned thread rolling conditions, as the durability evaluation test 1. FIG. 7 is a chart of a plurality of types of the hard films different in the atomic composition and the film thickness t attached to cover the test taps used in the durability evaluation test 2 and the durability test results (machined hole numbers and judgments) of the test taps. The test taps include the conventional products 1 to 8 acquired by using the hard films containing at least Ti without containing W, V, and O and the test products 1 to 10 acquired by using the hard films containing the same metal elements (Ti, Cr, Mo, W, and V) as the inventive products as well as C, N, and O at atom ratios that are deviated from the ranges of the inventive products.

In FIG. 7, a rolled internal thread within a standard is defined as an accepted hole and a test tap capable of machining 2000 or more accepted holes is evaluated as an accepted product, as in FIG. 5. All the inventive products 1 to 45 are evaluated as the accepted products and the conventional products 1 to 8 and the test products 1 to 10 are all evaluated as rejected products. The hard films of the inventive products 1 to 45 evaluated as the accepted products are TiCrMoWV oxycarbonitride within a range of 2.0 to 10.0 μm with chemical compositions represented by $(Ti_aCr_bMo_cW_dV_e)_{1-x-y-z}C_xN_yO_z$, and have the atom ratios represented by $0.2 \leq a \leq 0.7$, $0.01 \leq b \leq 0.4$, $0.05 \leq c \leq 0.5$, $0 \leq d \leq 0.05$, $0 \leq e = 1-a-b-c-d \leq 0.05$, $0.3 \leq x+y+z \leq 0.6$, $0 \leq y \leq 0.5$, and $0 \leq z \leq 0.15$. This leads to fine crystals making up the hard film and an extremely smooth surface of the hard film and, therefore, the machining tool hard film having abrasion resistance and welding resistance as well as smoothness is acquired.

The crystal grain diameters of the hard films formed on the surfaces of the test taps were evaluated by structure observation using a TEM (transmission electron microscope), and measuring the crystal grain diameters, as in the durability evaluation test 1. The inventive products 1 to 45 exhibited fine crystal grains of 40 to 90 nm. On the other hand, the conventional products 1 to 8 and the test products 1 to 10 exhibited at least 120 nm or more and all had values exceeding 100 nm.

Figure 8:
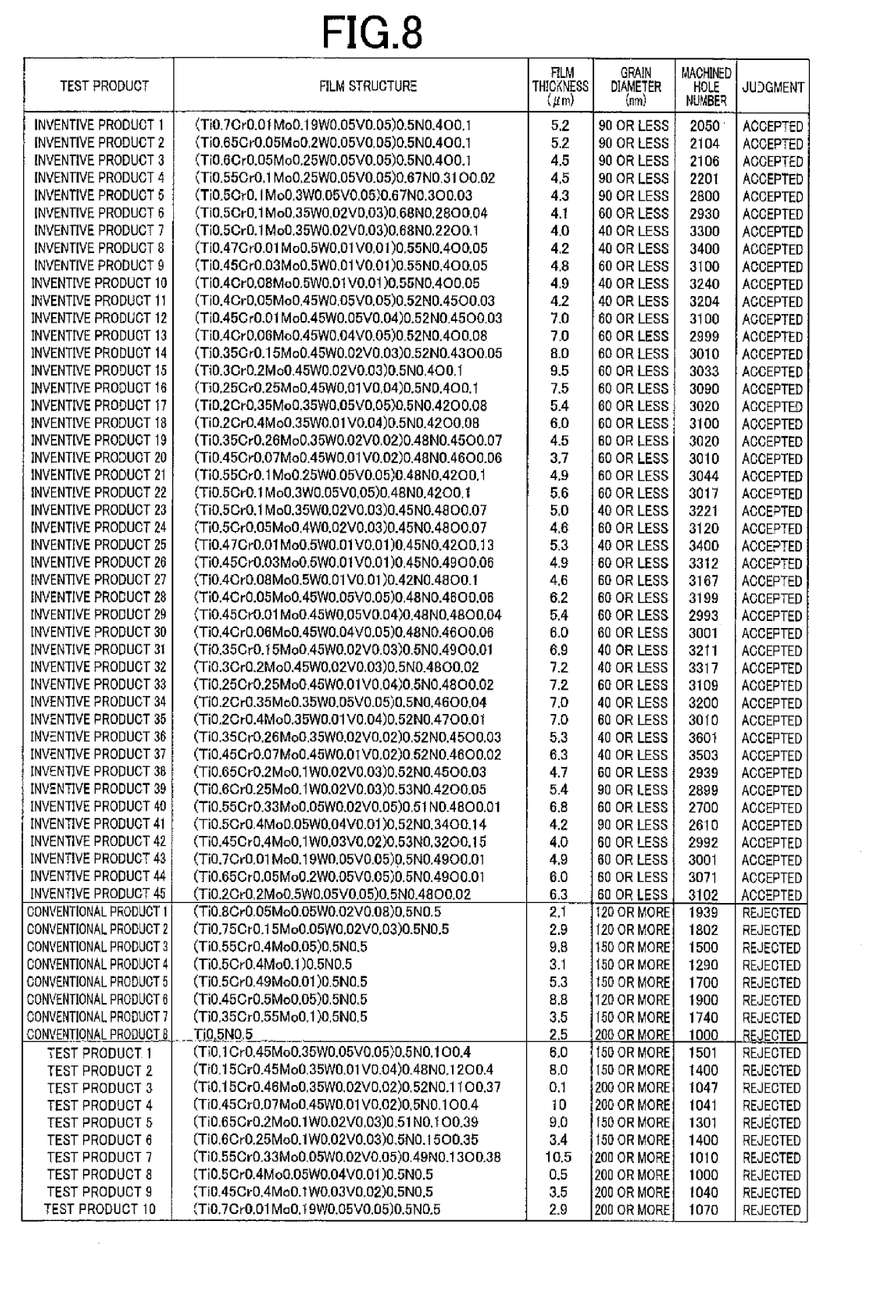
FIG. 8 is a chart illustrating atomic composition, film thickness of the hard film and the durability test results (machined hole numbers and judgments) for each of the test taps used in a durability evaluation test 3, where the durability evaluation test 3 evaluates the durability of the tool hard film of FIGS. 1 to 3 made of the TiCrMoWV oxynitride.

[Durability Evaluation Test 3]
Description will be made of a durability evaluation test 3 conducted by the present inventors for verifying the effect of the abrasion resistance, welding resistance, and smoothness of the hard film 30 made of the TiCrMoWV oxynitride having fine crystals due to introduction of oxynitride and a phase with a NaCl-type crystal structure as a main phase. The present inventors prepared test taps (inventive products 1 to 45, conventional products 1 to 8, and test (comparison) products 1 to 10) by coating rolling taps having a tool diameter of 6 (mmø) with a plurality of types of hard films different in atomic composition and film thickness t depicted in FIG. 8, and evaluated each of the test taps by performing thread rolling under the above-mentioned thread rolling conditions, as the durability evaluation tests 1 and 2. FIG. 8 is a chart of a plurality of types of the hard films different in the atomic composition and the film thickness t attached to cover the test taps used in the durability evaluation test 3 and the durability test results (machined hole numbers and judgments) of the test taps. The test taps include the conventional products 1 to 8 acquired by using the hard films containing at least Ti, C, and N without containing O and the test products 1 to 10 acquired by using the hard films containing the same metal elements (Ti, Cr, Mo, W, and V)

as the inventive products as well as N and O at atom ratios that are deviated from the ranges of the inventive products.

In FIG. 8, a rolled internal thread within a standard is defined as an accepted hole and a test tap capable of machining 2000 or more accepted holes is evaluated as an accepted product, as in FIGS. 5 and 7. All the inventive products 1 to 45 are evaluated as the accepted products and the conventional products 1 to 8 and the test products 1 to 10 are all evaluated as rejected products. The hard films of the inventive products 1 to 45 evaluated as the accepted products are TiCrMoWV oxynitride within a range of 3.7 to 9.5 µm with chemical compositions represented by $(Ti_aCr_b Mo_cW_dV_e)_{1-x-y}N_xO_y$, and have the atom ratios represented by $0.2 \leq a \leq 0.7$, $0.01 \leq b \leq 0.4$, $0.05 \leq c \leq 0.5$, $0 \leq d \leq 0.05$, $0 \leq e = 1-a-b-c-d \leq 0.05$, $0.3 \leq x+y \leq 0.6$, and $0 \leq y \leq 0.15$. This leads to fine crystals making up the hard film and an extremely smooth surface of the hard film and, therefore, the machining tool hard film having abrasion resistance and welding resistance as well as smoothness is acquired.

The crystal grain diameters of the hard films formed on the surfaces of the test taps were evaluated by structure observation using a TEM (transmission electron microscope), and measuring the crystal grain diameters, as in the durability evaluation tests 1 and 2. The inventive products 1 to 45 exhibited fine crystal grains of 40 to 90 nm. On the other hand, the conventional products 1 to 8 and the test products 1 to 10 exhibited at least 120 nm or more and all had values exceeding 100 nm.

As described above, according to the hard film 30 fixedly attached to the rolling tap 10 of this embodiment, since the TiCrMoWV oxycarbide, oxynitride, or oxycarbonitride having a phase with a NaCl-type crystal structure as a main phase has fine crystals due to introduction of oxygen and therefore provides an extremely smooth surface and a low friction coefficient of the hard film, the hard film can have the abrasion resistance and the welding resistance as well as the smoothness and because the hard film has the excellent smoothness and the low friction coefficient in addition to the abrasion resistance and the welding resistance, the tool life is elongated.

If the hard film 30 is made of the TiCrMoWV oxycarbide $(Ti_aCr_bMo_cW_dV_e)_{1-x-y}C_xO_y$, since the atom ratios are $0.2 \leq a \leq 0.7$, $0.01 \leq b \leq 0.4$, $0.05 \leq c \leq 0.5$, $0 \leq d \leq 0.05$, $0 \leq e=1-a-b-c-d \leq 0.05$, $0.3 \leq x+y \leq 0.6$, and $0 \leq y \leq 0.15$ and, therefore, the crystals making up the hard film 30 become fine and make the surface of the hard film extremely smooth, the hard film 30 can have the abrasion resistance and the welding resistance as well as the smoothness.

If the hard film 30 is made of the TiCrMoWV oxycarbonitride $(Ti_aCr_bMo_cW_dV_e)_{1-x-y-z}C_xN_yO_z$, since the atom ratios are $0.2 \leq a \leq 0.7$, $0.01 \leq b \leq 0.4$, $0.05 \leq c \leq 0.5$, $0 \leq d \leq 0.05$, $0 \leq e=1-a-b-c-d \leq 0.05$, $0.3 \leq x+y+z \leq 0.6$, $0 \leq y \leq 0.5$, and $0 \leq z \leq 0.15$ and, therefore, the crystals making up the hard film 30 become fine and make the surface of the hard film extremely smooth, the hard film 30 can have the abrasion resistance and the welding resistance as well as the smoothness.

If the hard film 30 is made of the TiCrMoWV oxynitride $(Ti_aCr_bMo_cW_dV_e)_{1-x-y}N_xO_y$, since the atom ratios are $0.2 \leq a \leq 0.7$, $0.01 \leq b \leq 0.4$, $0.05 \leq c \leq 0.5$, $0 \leq d \leq 0.05$, $0 \leq e=1-a-b-c-d \leq 0.05$, $0.3 \leq x+y \leq 0.6$, and $0 \leq y \leq 0.15$ and, therefore, the crystals making up the hard film 30 become fine and make the surface of the hard film extremely smooth, the hard film 30 can have the abrasion resistance and the welding resistance as well as the smoothness.

Since the hard film 30 of this embodiment is a 0.2 to 10.0 µm thick single layer coating the surface of the rolling tap 10, the hard film 30 with high abrasion resistance and welding resistance as well as smoothness can be acquired in fewer processes and, therefore, the rolling tap 10 becomes inexpensive.

Although the preferred embodiment of the present invention has been described in detail with reference to the drawings, the present invention is not limited thereto and is implemented with various modifications applied within a range not departing from the spirit thereof.

NOMENCLATURE OF ELEMENTS

10: rolling tap (hard-film-coated metal machining tool)
18: tool substrate
30: hard film (tool hard film)

The invention claimed is:

1. A tool hard film that is to be disposed as coating on a surface of a tool,
   the tool hard film being a TiCrMoWV oxycarbide, oxynitride, or oxycarbonitride having a phase with a NaCl-type crystal structure as a main phase, the oxycarbide, oxynitride, or oxycarbonitride having fine crystals due to introduction of oxygen.

2. The tool hard film of claim 1, wherein the TiCrMoWV oxycarbide is represented by $(Ti_aCr_bMo_cW_dV_e)_{1-x-y}C_xO_y$, and wherein atom ratios thereof are $0.2 \leq a \leq 0.7$, $0.01 \leq b \leq 0.4$, $0.05 \leq c \leq 0.5$, $0 \leq d \leq 0.05$, $0 \leq e=1-a-b-c-d \leq 0.05$, $0.3 \leq x+y \leq 0.6$, and $0 \leq y \leq 0.15$.

3. The tool hard film of claim 1, wherein the TiCrMoWV oxycarbonitride is represented $(Ti_aCr_bMo_cW_dV_e)_{1-x-y-z}C_xN_yO_z$, and wherein
   atom ratios thereof are $0.2 \leq a \leq 0.7$, $0.01 \leq b \leq 0.4$, $0.05 \leq c \leq 0.5$, $0 \leq d \leq 0.05$, $0 \leq e=1-a-b-c-d \leq 0.05$, $0.3 \leq x+y+z \leq 0.6$, $0 \leq y \leq 0.5$, and $0 \leq z \leq 0.15$.

4. The tool hard film of claim 1, wherein the TiCrMoWV oxynitride is represented by $(Ti_aCr_bMo_cW_dV_e)_{1-x-y}N_xO_y$, and wherein atom ratios thereof are $0.2 \leq a \leq 0.7$, $0.01 \leq b \leq 0.4$, $0.05 \leq c \leq 0.5$, $0 \leq d \leq 0.05$, $0 \leq e=1-a-b-c-d \leq 0.05$, $0.3 \leq x+y \leq 0.6$, and $0 \leq y \leq 0.15$.

5. The tool hard film of claim 1, wherein the tool hard film has a crystal grain diameter of 100 nm or less.

6. The tool hard film of claim 1, wherein the tool hard film is a 0.2 to 10.0 µm thick single layer coating the surface of the tool.

7. A hard-film-coated metal machining tool having the tool hard film of claim 1 disposed as coating on a surface of the tool.

* * * * *